United States Patent [19]
Norman et al.

[11] Patent Number: 5,322,712
[45] Date of Patent: Jun. 21, 1994

[54] PROCESS FOR IMPROVED QUALITY OF CVD COPPER FILMS

[75] Inventors: John A. T. Norman, Encinitas; Arthur K. Hochberg, Solana Beach; David A. Roberts, Carlsbad, all of Calif.

[73] Assignee: Air Products and Chemicals, Inc., Allentown, Pa.

[21] Appl. No.: 64,185

[22] Filed: May 18, 1993

[51] Int. Cl.$^5$ ............................................. C23C 16/00
[52] U.S. Cl. ............................ 427/250; 427/255.1; 427/248.1; 427/314; 427/124
[58] Field of Search .................. 427/250, 255.1, 248.1, 427/314, 124

[56] References Cited

U.S. PATENT DOCUMENTS

| | | | |
|---|---|---|---|
| 5,085,731 | 2/1992 | Norman et al. | 156/646 |
| 5,094,701 | 3/1992 | Norman et al. | 148/23 |
| 5,098,516 | 3/1992 | Norman et al. | 156/666 |

OTHER PUBLICATIONS

Jain et al, "Chemical Vapor Deposition of Copper from Hexafluoroacetylacetonato Copper (I) Vinylerimethylsilane", J. Electrochem. Soc. vol. 140, No. 5, Nay 1993 pp. 1434-1439.

Donnelly et al, "Copper Metalorganic Chemical Vapor Deposition Reactions of Hexafluoroacetylacetonate Cu(I) Vinylerimethylsilane and Bis(Hexafluoroacetylacetonate) Cu(II) Adsorbed on Titanium Nitride" J. Vac. Sci. Technol. A11(1), Jan./Feb. 1993, pp. 66-77.

J. A. T. Norman, et al.; A New Metal-Organic Chemical Vapor Deposition Process of Selective Copper, Metallization Mater. Sci. and Eng. B17(1993) pp. 87-92.

F. A. Houle, et. al. Surface Processes Leading to Carbon Contamination of Photochemically Deposited Copper Films, pp. 2452-2458 J. Vac. Sci. Technol. A4(6) Nov./Dec. 1986.

C. Oehr, et al; Thin Copper Films by Plasma CVD Copper-Hexafluoro-Acetylacetona App. Phys. A45 1988 pp. 151-154.

D. Temple, et al; 'Chemical Vapor Deposition of Copper From Copper(II) Hexafluoroacetylacetonate', J. Electrochem. Soc. 136(11), Nov. 1989 pp. 3525-3529.

Rudy L. Van Hemert, et al; Vapor Deposition of Metals by Hydrogen Reduction of Metal Chelates pp. 1123-1126 J. Electrochem. Soc. 112(11) Nov. 1965.

D. B. Beach, et al; Low Temperature Chemical Vapor Deposition of High Purity . . . pp. 216-219 Chem. Mater. 1990.

W. G. Lai, et al; Atmospheric Pressure Chemical Vapor Deposition of Copper Thin Film J. Electrochem. Soc., vol. 138, No. 11, Nov. 1991, pp. 3499-3504.

N. Awaya, et al.; 'Deposition Mechanism of Copper CVD', Conference Proceedings ULSI-VII, MRS 1992, pp. 345-354.

P. M. Jeffries, et al; Chemical Vapor Deposition of Copper and Copper Oxidee Thin Films . . . Chemistry of Materials 1989, pp. 8-10.

C. R. Moylan, et al; LCVD of Copper: Deposition Rates and Deposit Shapes pp. 1-5; Appl. Phys. A40, 1-5 (1986).

C. R. Jones, et al; Photochemical Generation and Deposition of Copper from Jus Phase Precursor, Appl. Phys. Lett. 46(1), Jan. 1985 pp. 97-99.

A. E. Kaloyeras, et al; Low-Temperature Metal-Organic Chemical Vapor Deposition . . . J. Electronic Materials, 19(3) 1990 pp. 271-276.

T. Ohba, et al; Deposition and Properties of Blanket-W Using Silane Reduction; MRS Ed. by S. Wong et al 1990; pp. 273-279.

T. Ohba, et al. Selective Chemical Vapor Deposition of Tungsten Using Silane . . . ; Tech. Dig. IEDM, 213 (1987); pp. 17-24.

P. V. Andrews, et al; The Effect of Grain Boundries on the Electrical Resistivity . . . ; Phil. Mag. 19 887 (1969); pp. 887-897.

*Primary Examiner*—Roy V. King
*Attorney, Agent, or Firm*—James C. Simmons; William F. Marsh

[57] ABSTRACT

Chemical Vapor Deposition of copper films is enhanced by simultaneously introducing in the reactor vapor of an organometallic copper precursor and copper complex vapor of a volatile ligand or the hydrate of the ligand.

7 Claims, 3 Drawing Sheets

PROCESS FOR IMPROVED QUALITY OF CVD COPPER FILMS

FIELD OF THE INVENTION

The present invention relates to Chemical Vapor Deposition (CVD) copper films deposited onto either conducting metallic or insulating surfaces.

BACKGROUND OF THE INVENTION

In the electronics industry there is a steady trend towards manufacturing integrated circuitry of increasingly higher speed and larger information storage capacity. This requires the individual electrical devices such as transistors, etc. within the integrated circuitry to be fabricated at an increasingly small scale. The metallic electrical interconnects between the devices also need to be miniaturized. As device and interconnect dimensions approach one-half to one-quarter of a micron, the choice of interconnect metal becomes critical. The large current densities resulting from small interconnect cross sectional areas can lead to major problems such as electromigration, stress migration and voiding where the metal lines become fractured or otherwise physically degraded under operating conditions, a major drawback with aluminum alloys. Metal interconnects also need to provide the lowest electrical resistance path possible since resistance-capacitance delays become a dominant factor in circuit performance at sub half micron levels. The aluminum that is widely used in present day interconnect manufacturing is reasonably conductive (2.7 microhm cm), but needs to be alloyed with 0.5 to 4.0% Cu to minimize the electromigration tendencies of the pure metal. Tungsten, also widely used, is electromigration resistant but is of higher resistivity (5.4 microhm cm). Considering these facts, copper should be an excellent interconnect metal as it is both highly conductive (1.7 microhm cm) and electromigration resistant.

Metallic interconnects are typically horizontal lines (runners) or plugs (vias) that wire together devices in microprocessors. At feature sizes of >1 micron these metallic components can be built into the microcircuits by PVD (Physical Vapor Deposition) techniques such as sputtering or evaporation. In essence PVD consists of condensing a metal vapor onto a surface/cp system-dict /curr or channel of a circuit where an electrical connection needs to be formed. Since this is a non-selective metallization, either a postdeposition clean-up (i.e. etch-back) or a predeposition masking of the substrate (i.e. the lift-off technique) is required in order to prepare individual discrete metal components. However, the severe surface topographies presented by sub-micron features preclude the effective use of PVD since this "line of sight" technique cannot provide a uniform conformal coating on such high aspect ratio highly convoluted surfaces. Specific examples of these shortcomings include the phenomena of geometrical shadowing and poor step coverage.

A superior process for producing these microscopic metal features is CVD (Chemical Vapor Deposition). In this technique a volatile metal-organic compound in the gas phase is contacted with areas of a circuit where growth of metal film (i.e. interconnect) is required. A surface catalyzed chemical reaction then occurs which leads to deposition of the desired metal. Since this is a chemical reaction, there is potential for it to provide surface selective metallization. That is, CVD metal deposition can be made to occur at only specific locations compared to the non-selective PVD processes. Also, since the metal film steadily grows on the desired surface it is of a uniform thickness and highly conformal even to severe geometries. In this respect CVD is naturally suited to fabricating submicron high aspect ratio features.

An example of a currently available selective CVD metallization is the deposition of tungsten onto a silicon surface using tungsten hexafluoride as the volatile organometallic precursor (see T. Ohba, et al., "Tungsten and Other Advanced Metals for VLSI/ULSI Applications V," Ed. by S. S. Wong and S. Furukawa, MRS, Pittsburgh, Pa., 273 (1990) ). The chemistry that drives this process can be divided into two steps. Initially the $WF_6$ reacts with the elemental silicon surface to yield tungsten metal and volatile silicon hexafluoride. Hydrogen gas is then added to the system which reduces further $WF_6$ at the freshly formed metal surface thereby yielding additional tungsten and HF gas. However, loss of selectivity can be observed and is commonly ascribed to the corrosive nature of HF. T. Ohba, et al., Tech. Dig. IEDM, 213 (1987) teach the use of silane as a reducing agent for $WF_6$ to achieve higher deposition rates while avoiding the production of HF gas. More recently diethylsilane/hydrogen has also been successfully used to reduce $WF_6$ under CVD conditions (D. A. Roberts, A. K. Hochberg, A. Lagendijk, D. Garg, S. M. Fine, J. G. Fleming, R. D. Lujan, R. S. Blewer, "The LPCVD of Tungsten films by the Diethylsilane/$H_2$ Reduction of $WF_6$" MRS Proc. ULSI-Vll, 1992, 127).

Desirable selectivities for a copper CVD process include deposition onto conducting metallic or metallic like surfaces such as tungsten, tantalum, or titanium nitride versus insulating surfaces such as silicon oxide. These metallic surfaces provide a diffusion barrier between the CVD copper and the underlying silicon substrate that the device is grown upon.

Copper films have previously been prepared via CVD using various copper precursors. Most of these compounds will only deposit copper metal at temperatures higher than 200° C Historically, the best known and most frequently used CVD copper precursor is the solid compound copper$^{+2}$ bis(hexafluoroacetylacetonate). This highly fluorinated organometallic precursor is significantly more volatile than its parent unfluorinated complex copper$^{+2}$bis(acetylacetonate) and its ease of vaporization readily lends this compound towards CVD processes. The use of this compound as a general precursor for CVD copper metallization was first described by R. L. VanHemert et al. *J. Electrochem. Soc.* (112), 1123 (1965) and by R. W. Moshier et al. U.S. Pat. No. 3,356,527. Reisman, et al., *J. Electrochemical Soc.*, Vol. 136, No. 11, Nov. 1989 and A. E. Kaloyeros et al., *J. Electronic Materials, Vol.* 19, No 3, 271 (1990) in two independent studies have also evaluated the use of this compound as a copper precursor for electronics applications. In these studies copper films were formed by contacting vapors of copper $^{+2}(hfac)_2$, mixed with either an inert gas (argon) or with hydrogen and contacting the mixture with a heated substrate surface. In the case of using hydrogen the copper $^{+2}$ atom in the precursor complex is formally reduced to copper metal while the hfac$^{-1}$ ligand becomes protonated to yield a neutral volatile compound. In the case of using an inert gas the copper $^{+2}(hfac)_2$ is simply pyrolyzed to give copper metal and fragments of the hfac ligand. Pure copper is generally reported for hydrogen reductions but oxygen and carbon are found in the films obtained by pyrolysis. Copper films have also been prepared from copper $^{+2}$(hfac)$_2$ by plasma enhanced deposition, C. Oehr, H. Suhr, Appl. Phy. A. (45) 151-154 (1988), laser photothermal decomposition, F. A. Houle; C. R. Jones; T. Baum; C. Pico; C. A. Korae; *Appl. Phys Lett.* (46) 204-206 (1985) and photochemical decomposition of copper $^{+2}$(hfac)$_2$ ethanol adducts, F. A. Houle, R. J. Wilson; T. H. Baum; *J. Vac. Sci. Technol. A* (4), 2452-2458 (1986). Some of these methods yield fluorine contaminated films and none are reported to yield selective depositions. Mixtures of water vapor and hydrogen have also been used for the reduction of copper$^{+2}$ (hfac)$_2$ (N. Awaya and Y. Arita, Conf. Proc. ULSI-VII 1992 MRS p345.). Hydrogen reduction of similar volatile copper compounds has also been demonstrated by Charles et al. U.S. Pat. No. 3,594,216 using copper $^{+2}$ β-ketoimine complexes at 400° C. to deposit copper metal films onto glass or quartz substrates. No mention of selectivity is made. G. S. Girolami, et al., *Chem. Mater.* (1) 8-10 (1989) reported using solid copper $^{+1}$ t-butoxide to yield copper films by CVD at 400° C., but the resultant films were impure in that they contained 5% oxygen.

One class of CVD precursors known to deposit pure copper metal films below 200° C. are the copper$^{+1}$ cyclopentadienyl phosphine compounds described by Beech et al., *Chem. Mater,* (2) 216-219 (1990), but these are also not reported to be strongly selective towards metallic or metallic like surfaces vs. silicon oxide or similar insulating dielectrics. An additional problem that this particular class of compounds faces for electronics applications is their potential to contaminate microcircuits with phosphorus, an element that is extensively used as a silicon dopant.

Selective deposition of pure copper films by CVD at low temperatures onto metallic substrates using Cu$^{+1}$ (hexafluoroacetylacetonate) .L complexes (where L=alkene or alkyne) have been described previously by Norman et al in U.S. Pat. Nos. 5,085,731; 5,094,701 and 5,098,516. Under certain conditions blanket (non-selective) deposition can also be achieved using these precursors (J. A. T. Norman, B. A. Muratore, P. N. Dyer, D. A. Roberts, A. K. Hochberg and L. H. Dubois E-MRS proc. B17 (1993) 87-92). A particularly effective CVD copper precursor is 1,1,1,5,5,5-hexafluoro-2,4-pentanedionato-copper (I) trimethylvinylsilane sold under the trademark CupraSelect by the Schumacher unit of Air Products and Chemicals, Inc., Carlsbad, Calif. This compound, Cu(hfac)(TMVS), is known to deposit quality copper films.

SUMMARY OF THE INVENTION

A method (process) for chemical vapor deposition of improved quality copper films by introducing into a CVD reactor vapors of an organometallic copper complex, e.g. 1,1,1,5,5,5-hexafluoro-2,4-pentanedionato copper(I) trimethylvinylsilane together with at least one percent (1%) by volume of the volume of copper complex vapors of a volatile ligand or ligand hydrate. The volatile ligand or ligand hydrate has the general formula:

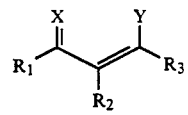

Where $R_1$, $R_3$, $R_4$, and $R_5$ are alkyl, aryl, fluoroalkyl or fluoroaryl; $R_2$ is halogen, alkyl, aryl, fluoroalkyl or fluoroaryl; X and Y are selected so that when X=O, Y can be OH, NH$_2$ or N(R$_4$)H, when X=NH, Y can be NH$_2$ or N(R$_4$)H, when X=NR$_5$, Y can be N(R$_4$)H. Useful stable volatile hydrates of these ligands can also be used. These are compounds that contain between one and six molecules of reversibly chemically bound water molecules per molecule of ligand. In some cases it may not be desirable to mix the hydrate of the ligand and the copper complex prior to introduction into the deposition chamber.

The organometallic copper complexes suitable for this present invention of the formula shown below:

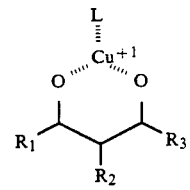

Where $R_1$, and $R_3$ can be alkyl, fluoroalkyl, aryl, fluoroaryl and $R_2$ alkyl, fluoroalkyl, aryl, fluoroaryl or halogen and L is a nonaromatic unsaturated ligand such as alkene or alkyne. The use of this family of volatile copper complexes as copper CVD precursors has been previously described in U.S. Pat. Nos. 5,085,731, 5,094,701 and 5,098,516.

DETAILED DESCRIPTION OF THE INVENTION

Figure 1:
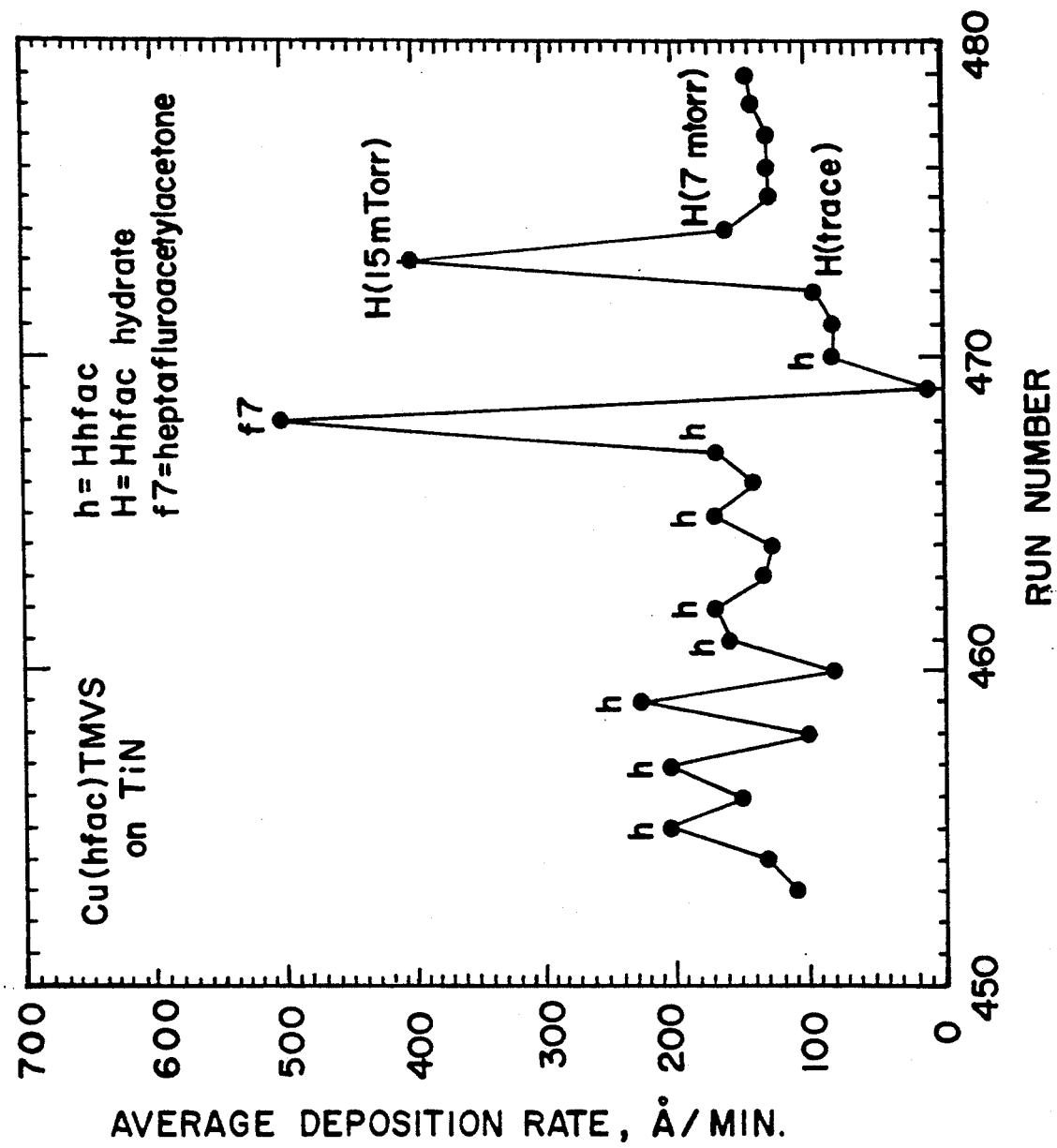
FIG. 1 is a plot of deposition rate for twenty seven CVD depositions of Cu(hfac)TMVS on titanium nitride substrates showing the effect of using this invention on selected runs.

The processes (methods) of the present invention enable the user of copper (1) compound such as organometallic compounds such as disclosed in U.S. Pat. Nos. 5,085,731, 5,094,701 and 5,098,516 the specifications of which are incorporated herein by reference to deposit pure copper films by CVD which films are exceptionally smooth and highly reflective.

Smooth metal films are typically highly desirable for microelectronics applications for the following reasons:

a. They are especially suited to subsequent lithography and patterning steps, more precise etching being possible due to their small grain sizes ("Chemical Vapor Deposition of Tungsten and Tungsten Silicides" edited by J. E. J. Schmitz, Noyes Publications 1992, p.102).

b. They provide superior electrical conduction due to the occurrence of less electron scattering when compared to rougher (i.e. larger grain size) films of the same metal. (P. V. Andrews, M. B. West, and C. R. Robeson "The Effect of Grain Boundaries on the Electrical Resistivity of Polycrystalline Copper and Aluminum." Phil. Mag. 19 887 (1969)).

Copper films grown by the invention herein disclosed also show excellent substrate edge to edge uniformity of film thickness that is superior to the uniformity achieved without the ligand addition as disclosed in this invention. Uniform deposition is particularly important to the semiconductor industry since it allows each device on the surface of a production wafer to receive an identical uniform layer of metal.

In addition to these advantages, the use of this invention leads to an enhanced rate of copper deposition onto selected substrates. This accelerated deposition rate is highly desirable since it reduces the overall CVD processing time that is required to grow the needed thickness of copper. Since this higher rate stems from a more efficient utilization of the precursor under CVD processing conditions, the quantity and hence the cost of precursor consumed per wafer is also reduced.

This invention is practiced by evaporating the ligand or ligand hydrate under reduced pressure and introducing this vapor into the CVD process chamber along with vapors of the copper precursor. If there is no chemical incompatability of the ligand and complex copper, the ligand can be directly mixed with the copper precursor to form a solution and this solution injected directly into a low pressure evaporation chamber. If a solid copper precursor is used, the addition of an inert solvent may be required to bring the precursor and ligand into solution. The resulting mixed vapor of copper precursor and ligand is then introduced into the CVD chamber. Various inert carrier gases such as argon, nitrogen or helium can be used to transport the copper precursor or ligand vapors into the CVD reactor.

During the course of our metalizations a "conditioning" phenomenon was observed whereby higher vapor pressures in the bubbler containing the Cu(hfac)TMVS compound were initially observed during a run along with high deposition rates of uniform copper. As bubbling was continued both the vapor pressure and deposition rate steadily decreased and film uniformity became poorer. It is believed that volatile species were outgassing from the bubbler which were responsible for the initial high deposition rate and more uniform films. With prolonged bubbling these components became depleted and the vapor pressure, the deposition rate and film uniformity became diminished. Since the prior art teaches that water vapor can accelerate the deposition of copper from CVD precursors (N. Awaya and Y. Arita, Conf. Proc. ULSI-Vll 1992 MRS p345.) it was believed that it could be responsible for the conditioning phenomenon. In the attempts to analyze for $H_2O$ in the Cu(hfac)TMVS compound trace $H_2O$ was shown to quickly break down to give a number of products, one of which is Hhfac 1,1,1,5,5,5-hexafluoro-2,4-pentanedione. Hhfac is the protonated "free ligand" of the hfac anion found in all "hfac" compounds. Since Hhfac is known to be an etchant of metal containing surfaces (Norman et al U.S. Pat. No. 5,094,701) and a suppressant of copper deposition from $CU^{+2}(hfac)_2$ (W. G. Lai, Y. Xie, and G. L. Griffin, *J. Electrochem Soc.,* Vol. 138, No 11 Nov. 1991) it was an unexpected result to discover its ability to accelerate the deposition of copper from a Cu precursor. Consistent with the above observations it was observed that when stringent precautions were taken to dry all of the equipment in contact with the precursor (and hence eliminate traces of Hhfac), under the same CVD conditions the deposition rate became greatly diminished. The copper films became less specular and nonuniform across the substrate. However, by deliberately adding Hhfac into the CVD chamber when using the precursor under these dry conditions the copper films produced were superior to those achieved when no Hhfac was present. This reaction of water with the Cu(hfac)TMVS precursor to give Hhfac was confirmed by adding 50 ppm of $H_2O$ to the pure, dry precursor under oxygen free conditions and showing the resultant presence of Hhfac ligand by gas chromatography/mass spectrometry. In addition solids were observed believed to be a mixture of copper and copper oxide.

For the purpose of the invention Hhfac hydrate (1,1,1,5,5,5-hexafluoro-2,4-pentanedione dehydrate) was prepared by adding 3.6 g water (0.2 moles) dropwise over a period of 10 minutes with stirring to a solution of 20.8 g of hexafluoro-acetylacetone (0.1 moles) dissolved in 300 ml of diethyl ether. The mixture was then stirred for an additional 30 minutes at room temperature. The ether was then stripped off under vacuum and the resulting solid twice sublimed under dynamic vacuum at 40° C./20 millitorr pressure.

A custom-built Vactronics coldwall stainless steel reactor fitted with a load lock was used for these studies. Helium carrier gas was used to transport precursor vapors into the CVD reactor by bubbling through a 200 g charge of CupraSelect precursor housed in a stainless steel vessel at 36° C. Prior to loading this vessel it was dried by heating to 220° C. under a dynamic vacuum of 20 millitorr for 4 hours. A liquid nitrogen cryogenic trap was connected between the bubbler and the vacuum pump to trap outgassing water. 40 sccm of He carrier gas were used in each run. The average duration of each run was 10 minutes. Wafer temperatures were set at 160° C. and the chamber pressure set at 500 mtorr using a feedback loop from a capacitance manometer to a throttle valve. Ligand vapors were introduced in the CVD chamber through a calibrated mass flow controller or a calibrated leak. The process steps for a typical metallization run in the presence of added ligand are listed below. Typically alternate runs were made with or without ligand added to show the effect of the addition.

1. Preheat the wafer sample in flowing nitrogen.
2. Begin injecting the ligand into the deposition chamber.
3. Open the valve on the copper source to the CVD chamber.
4. Begin the flow of copper precursor into the deposition chamber.
5. Set the pressure control to 500 millitorr.
6. After the preset run time of 10 minutes, open the throttle valve.
7. Stop helium bubbling through the CupraSelect compound.
8. Turn off the ligand flow.
9. Pump residual helium out of the bubbler.
10. Close off the copper source valve.
11. Evacuate the CVD chamber.
12. Alternately pump and nitrogen purge the CVD chamber three times.
13. Evacuate the CVD chamber down to a base pressure of 10 millitorr.

14. Open the slitvalve between the CVD chamber and the loadlock.
15. Extract the wafer from the CVD chamber using the robotic arm.
16. Close the slit valve.
17. Cool the wafer in nitrogen.

A total of 27 runs were made. As shown in FIG. 1 the addition of Hhfac designated by the letter h, Hhfac hydrate designated by the letter H or the vapors of 1,1,1,3,5,5,5-hepatafluoro-2,4-pentanedione designated as f7 to the vapors of Cu (hfac)TMVS in a CVD reactor resulted in the deposition rate being increased dramatically. Runs 450 through 467 show clearly the relative increase in the rate of deposition upon the addition of Hhfac to the CupraSelect. Run 468 shows a dramatic increase upon the deposition rate when f7 is added followed by a reduction of the rate only to 10 Å/min upon removal of this additive. The film was also relatively course and rough in run 469. The addition of Hhfac results in an increase in the rate and a return to smoother films as indicated by stylus profilometry. Run 471 did not show a large decrease in deposition rate but the film was noticeably rougher than run 470. Addition of Hhfac hydrate in run 472 gave a small increase in rate and a smoother film than 471. As more Hhfac hydrate was added the rate increased and the increase appeared to be proportional to the amount of Hhfac hydrate added to the reactor.

Figure 2:
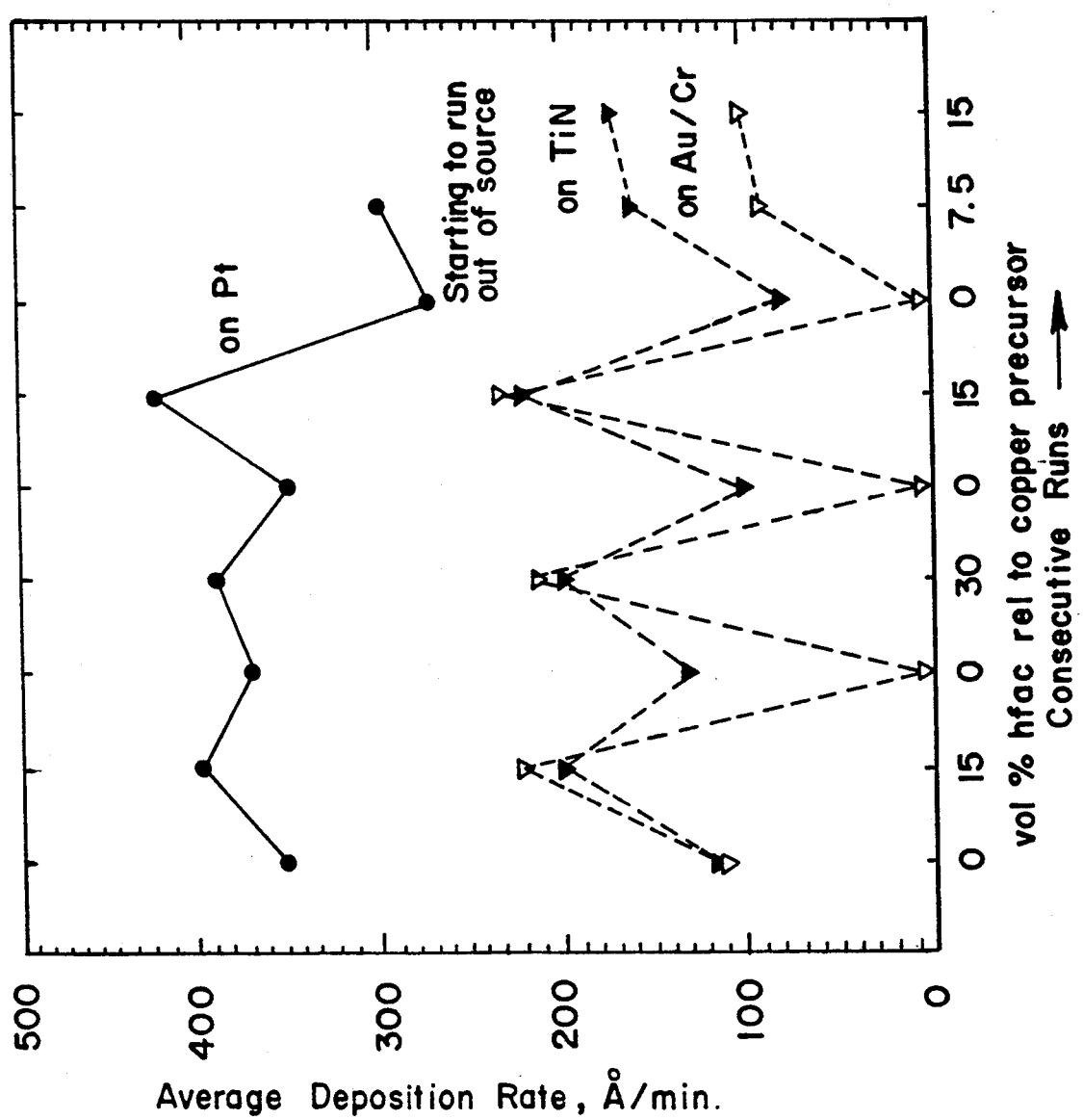
FIG. 2 is a plot of deposition rate against percentage addition of Hhfac to the Cu(hfac)TMVS precursor during deposition of copper on platinum, titanium nitride and gold-chromium alloy substrates.

As shown in FIG. 2 when Hhfac (1,1,1,5,5,5-hexafluoro-2,4-pentanedione) was added as a volume percentage of the Cu (hfac)TMVS precursor the deposition rate increased significantly for copper films being deposited on platinum, titanium nitride or a gold/chromium alloy substrate. As shown by the seventh data point for deposition on the platinum substrate in FIG. 2 the addition of 7.5 volume percent of Hhfac to the reactor still increased the deposition rate as the Cu(hfac)TMVS source was being depleted.

Figure 3:
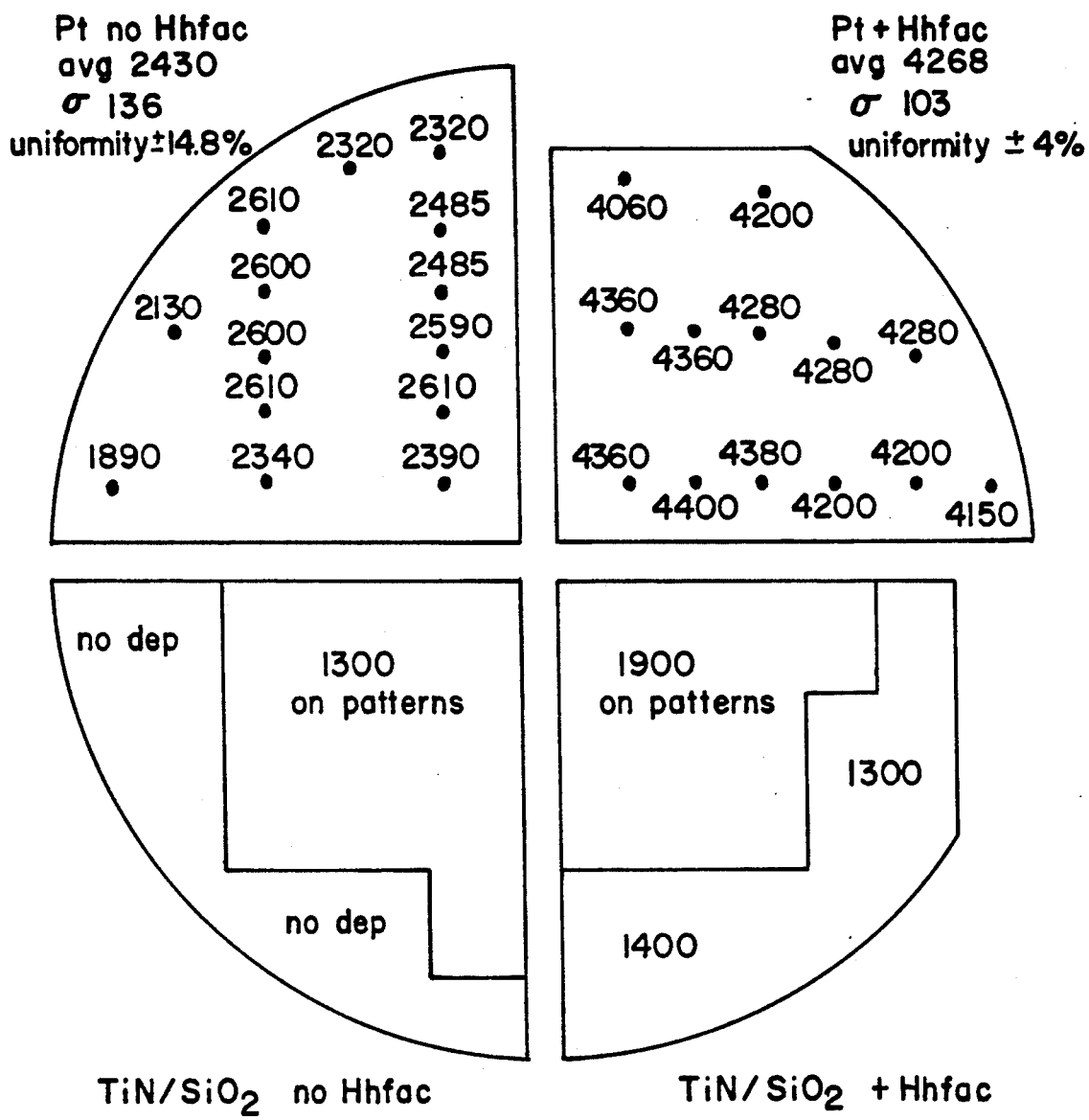
FIG. 3 is a reproduction of four copper film thickness maps used to illustrate this invention.

FIG. 3 shows four copper films thickness maps, as determined by the sheet resistivity (blanket areas) and stylus profilometry (patterned areas) of the copper films when processed with or without Hhfac. All other deposition conditions (wafer temperature 160° C., 40 sccm He carrier gas, precursor temperature 36° C., 500 milliTorr chamber pressure) for the Hhfac vs. no Hhfac samples were identical. The upper left hard quadrant shows depositions of copper on a platinum substrate with no addition of Hhfac to the precursor. The resulting film had an average thickness of 2,403 angstrom units with a standard deviation in thickness ($\sigma$) of 196 angstrom units or a uniformity of ±14.8%. The addition of Hhfac to the precursor resulted in the deposition shown in the upper right hand quadrant in FIG. 3 where the copper film on the platinum substrate had an average thickness of 4268 angstrom units with a standard deviation ($\sigma$) of 103 angstrom units or a uniformity of ±4.1%. The lower left and right quadrant samples of FIG. 3 were each given a patterned area of parallel lines of titanium nitride (TiN) deposited on the SiO$_2$ wafer in the area shown prior to exposure of the patterned substrate to CVD copper deposition. As shown by comparing the two lower quadrants when Hhfac was added to the precursor not only was the copper deposited to a greater depth on the lines, it was also deposited on the unpatterned TiN portion of the substrate. In both the platinum and titanium nitride cases the addition of Hhfac increased the copper film thickness.

Table 1 indicates how the reflectivity of the copper films processed in the presence of added Hhfac ligand is consistently higher than those films processed in the absence of added Hhfac ligand. These reflectance values for copper films are also controlled by the underlying metal film. That is, smoother base films will result in higher reflectances. For these tests, the base films for Hhfac vs. no Hhfac came from the same metallized wafers. The addition of Hhfac has improved the reflectances by reducing the surface roughnesses; rougher films will have lower reflection coefficients.

TABLE 1

| Wavelength (nm) | Si ref | Specular Reflection Coefficients | | | | | |
|---|---|---|---|---|---|---|---|
| | | Cu on Au | | Cu on Pt | | Cu on Al | |
| | | Hfac | no Hfac | Hfac | no Hfac | Hfac | no Hfac |
| 440 | .429 | .447 | .366 | .344 | .286 | .366 | .366 |
| 550 | .366 | .577 | .381 | .468 | .374 | .502 | .487 |
| 630 | .348 | .889 | .694 | .811 | .697 | .841 | .811 |

In accord with the invention the substrate can be heated to temperatures between 120° C. and 350° C., the reactor can be operated at a pressure of between 10 mTorr and 100 Torr and the copper precursor vapors introduced via an inert carrier gas such as helium, argon, nitrogen, neon xenon, krypton and mixtures thereof introduced into the CVD reactor at a rate of from 1 to 1000 sccm. Examples of ligand or ligand hydrate used with the present invention are hexafluoroaceytlacetone, heptafluoroacetylacetone or hexafluoroacetylacetone dehydrate.

As demonstrated above, the present invention is a process for improving the overall quality of copper films fabricated by chemical vapor deposition(CVD) from organometallic copper complexes. This is achieved by blending vapors of either ligands or their hydrates with vapors of the copper precursor as it is utilized in the CVD metallization. Specifically, the improvements that are made possible by this invention are as follows.

1. Enhancing the specularity of the film (i.e. producing a smoother metal film of smaller grain size).

2. Improving the uniformity of the copper film deposition across the area of substrate that is metallized. This substrate would typically be a silicon wafer of the type used in microelectronic semiconductor manufacturing.

3. Accelerating the rate of copper film deposition onto selected substrates.

4. Achieving a more efficient utilization of the copper CVD precursor in the metallization process.

Depending upon the choice of patterned metallic versus insulating (dielectric) substrates as well as subtle changes in reactor conditions these improvements can be applied to copper films deposited in either the selective or nonselective "blanket" deposition mode.

Having thus described our invention what is desired to be secured by letter patent of the United States is set forth in the appended claims.

1. A method for chemical vapor deposition of copper films on a substrate comprising the steps of:
   introducing vapors of a copper (I) organometallic precursor compound into a chemical vapor deposition (CVD) reactor; and
   simultaneously introducing into the reactor copper complex vapor of a volatile ligand or ligand hydrate having the general formula,

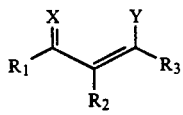

wherein R₁, and R₃, are selected from the group consisting of alkyl, aryl, fluoroalkyl or fluoroaryl, R₂ is a halogen, alkyl, fluoroalkyl or fluoroaryl, X and Y are selected so that when X=O, Y is OH, NH₂ or N(R₄)H, when X=NH, Y is NH₂ or N(R₄)H, when X=NR₅, Y is (R₄)H, and R₄ and R₅ are selected from the group consisting of alkyl, aryl, fluoroalkyl and fluoroaryl.

2. A method according to claim 1 wherein the substrate is heated to a temperature of between 120° C. and 350° C.

3. A method according to claim 1 wherein the CVD reactor is maintained at a pressure of between 10 mTorr and 100 Torr.

4. A method according to claim 1 wherein the vapors of the copper (I) organometallic precursor compound are introduced via an inert carrier gas selected from the groups consisting of helium, argon, nitrogen, neon, xenon, krypton and mixtures thereof introduced into the CVD reactor at a rate of from 1 sccm to 1000 sccm.

5. A method according to claim 1 wherein the volatile ligand or ligand hydrate is selected from the group consisting of hexafluoroacetylacetone, heptafluoroacetylacetone and hexafluoroacetylacetonedihydrate.

6. A method according to claim 1 wherein the copper (I) organometallic precursor compound is 1,1,1,5,5,5-hexafluoro-2,4 pentanedionato copper (I) trimethylvinylsilane and the ligand is 1,1,1,5,5,5-hexafluoro-2,4-pentanedione.

7. A method for chemical vapor deposition of copper films on a substrate comprising the steps of: introducing vapor of 1,1,1,5,5,5-hexafluoro-2,4pentanedianato copper (I) trimethylvinylsilane into a chemical vapor depositor reactor; and simultaneously introducing into the reactor copper complex vapor of 1,1,1,5,5,5-hexafluoro-2,4-pentanedione.

* * * * *